United States Patent
Park et al.

(10) Patent No.: US 11,610,845 B2
(45) Date of Patent: Mar. 21, 2023

(54) SEMICONDUCTOR PACKAGE AND A METHOD OF FABRICATING THE SAME

(71) Applicant: SAMSUNG ELECTRONICS CO., LTD., Suwon-si (KR)

(72) Inventors: Jongho Park, Daejeon (KR); Seung Hwan Kim, Asan-si (KR); Jun Young Oh, Seoul (KR); Kyong Hwan Koh, Asan-si (KR); Sangsoo Kim, Cheonan-si (KR); Dong-Ju Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/392,705

(22) Filed: Aug. 3, 2021

(65) Prior Publication Data

US 2021/0366832 A1    Nov. 25, 2021

Related U.S. Application Data

(63) Continuation of application No. 16/845,890, filed on Apr. 10, 2020, now Pat. No. 11,107,769.

(30) Foreign Application Priority Data

Aug. 2, 2019    (KR) .................... 10-2019-0094349

(51) Int. Cl.
*H01L 23/538*    (2006.01)
*H01L 25/065*    (2006.01)
(Continued)

(52) U.S. Cl.
CPC .......... *H01L 23/5384* (2013.01); *H01L 23/16* (2013.01); *H01L 23/31* (2013.01); *H01L 23/5385* (2013.01); *H01L 25/0652* (2013.01)

(58) Field of Classification Search
CPC ..... H01L 23/5384; H01L 23/16; H01L 23/31; H01L 23/5385; H01L 25/0652
See application file for complete search history.

(56) References Cited

U.S. PATENT DOCUMENTS

| | | |
|---|---|---|
| 7,838,336 B2 | 11/2010 | Bartley et al. |
| 8,624,364 B2 | 1/2014 | Chow et al. |

(Continued)

FOREIGN PATENT DOCUMENTS

| | | |
|---|---|---|
| JP | H06-314715 | 11/1994 |
| JP | 2006-286797 | 10/2006 |

*Primary Examiner* — Peniel M Gumedzoe
(74) *Attorney, Agent, or Firm* — F. Chau & Associates, LLC

(57) ABSTRACT

A semiconductor package including: a first package; a second package on the first package, the second package including a second package substrate, first and second semiconductor chips on the second package substrate, and a second molding part on the second package substrate and covering the first and second semiconductor chips; and a fill part between the first package and the second package, a first through hole that penetrates the second package substrate, the first through hole being between the first and second semiconductor chips, a second through hole that penetrates the second molding part, the second through hole being connected to the first through hole, and wherein the fill part has an extension disposed in the first through hole and the second through hole.

19 Claims, 14 Drawing Sheets

(51) Int. Cl.
  *H01L 23/16*  (2006.01)
  *H01L 23/31*  (2006.01)

(56) References Cited

U.S. PATENT DOCUMENTS

| | | |
|---|---|---|
| 9,105,647 B2 | 8/2015 | Hu et al. |
| 9,502,342 B2 * | 11/2016 | Kim .................... H01L 21/565 |
| 9,627,355 B2 | 4/2017 | Chen et al. |
| 2019/0067144 A1 | 2/2019 | Jeng et al. |
| 2019/0067249 A1 | 2/2019 | Huang et al. |
| 2019/0081023 A1 | 3/2019 | Guzek |
| 2019/0081027 A1 | 3/2019 | Kumar et al. |
| 2019/0096856 A1 | 3/2019 | Hwang et al. |
| 2019/0103362 A1 | 4/2019 | Lin et al. |
| 2019/0103385 A1 | 4/2019 | Karhade et al. |
| 2019/0115325 A1 | 4/2019 | Im et al. |
| 2021/0035913 A1 | 2/2021 | Park et al. |

* cited by examiner

SEMICONDUCTOR PACKAGE AND A METHOD OF FABRICATING THE SAME

CROSS-REFERENCE TO RELATED APPLICATIONS

This application is a continuation of U.S. patent application Ser. No. 16/845,890 filed on Apr. 10, 2020, which claims priority under 35 U.S.C. § 119 to Korean Patent Application No. 10-2019-0094349 filed on Aug. 2, 2019 in the Korean Intellectual Property Office, the disclosures of which are incorporated by reference herein in their entireties.

TECHNICAL FIELD

The present inventive concept relates to a semiconductor package and a method of fabricating the same.

DISCUSSION OF RELATED ART

In the semiconductor industry, semiconductor devices and the electronic products in which they are employed increasingly require high performance, rapid operating speeds, and compact sizes. To cope with this trend, numerous stacking methods have been developed. For example, a plurality of semiconductor chips may be stacked on a single substrate or a package may be stacked on another package. Package-on-package (POP) is an integrated circuit packaging method in which various semiconductor chips are vertically stacked to implement high-density chip stacking. The POP technique is capable of integrating semiconductor chips having various functions on a smaller area than a conventional package made of one semiconductor chip.

SUMMARY

According to exemplary embodiments of the present inventive concept, a semiconductor package may include: a first package; a second package on the first package, the second package including a second package substrate, first and second semiconductor chips on the second package substrate, and a second molding part on the second package substrate and covering the first and second semiconductor chips; and a fill part between the first package and the second package, a first through hole that penetrates the second package substrate, the first through hole being between the first and second semiconductor chips, a second through hole that penetrates the second molding part, the second through hole being connected to the first through hole, and wherein the fill part has an extension disposed in the first through hole and the second through hole.

According to exemplary embodiments of the present inventive concept, a semiconductor package may include: a lower package that includes a lower package substrate, a lower semiconductor chip on the lower package substrate, and a lower molding part that is on the lower package substrate and covers the lower semiconductor chip; an upper package on the lower package, the upper package including an upper package substrate, first and second upper semiconductor chips on the upper package substrate, and an upper molding part that is on the upper package substrate and covers the upper semiconductor chips; an interposer substrate between the upper package substrate and the lower semiconductor chip; and an under-fill part that fills a space between the interposer substrate and the upper package substrate, wherein the under-fill part includes a protrusion extended between the upper package substrate and the upper molding part toward a top surface of the upper molding part, and wherein the upper molding part includes a first segment disposed between the upper package substrate and the protrusion.

According to exemplary embodiments of the present inventive concept, a method of fabricating a semiconductor package may include: forming a first through hole that penetrates a package substrate; coating a molding member on the package substrate to form a molding part; forming a second through hole that penetrates the molding part and is connected to the first through hole; mounting the package substrate on a package; and placing an under-fill member in the first through hole and the second through hole to fill a space between the package substrate and the package.

According to exemplary embodiments of the present inventive concept, a semiconductor package may include: a first package; a second package overlapping the first package, the second package including a package substrate and first and second semiconductor chips disposed on the package substrate; and a fill part disposed between the first package and the second package, wherein the fill part includes a segment that extends in a vertical direction with respect to a surface of the first package, the segment extending between an opening in the package substrate and between the first and second semiconductor chips.

DETAILED DESCRIPTION OF THE EMBODIMENTS

Hereinafter, a semiconductor package according to exemplary embodiments of the present inventive concept will be described with reference to the accompanying drawings.

Figure 1A:
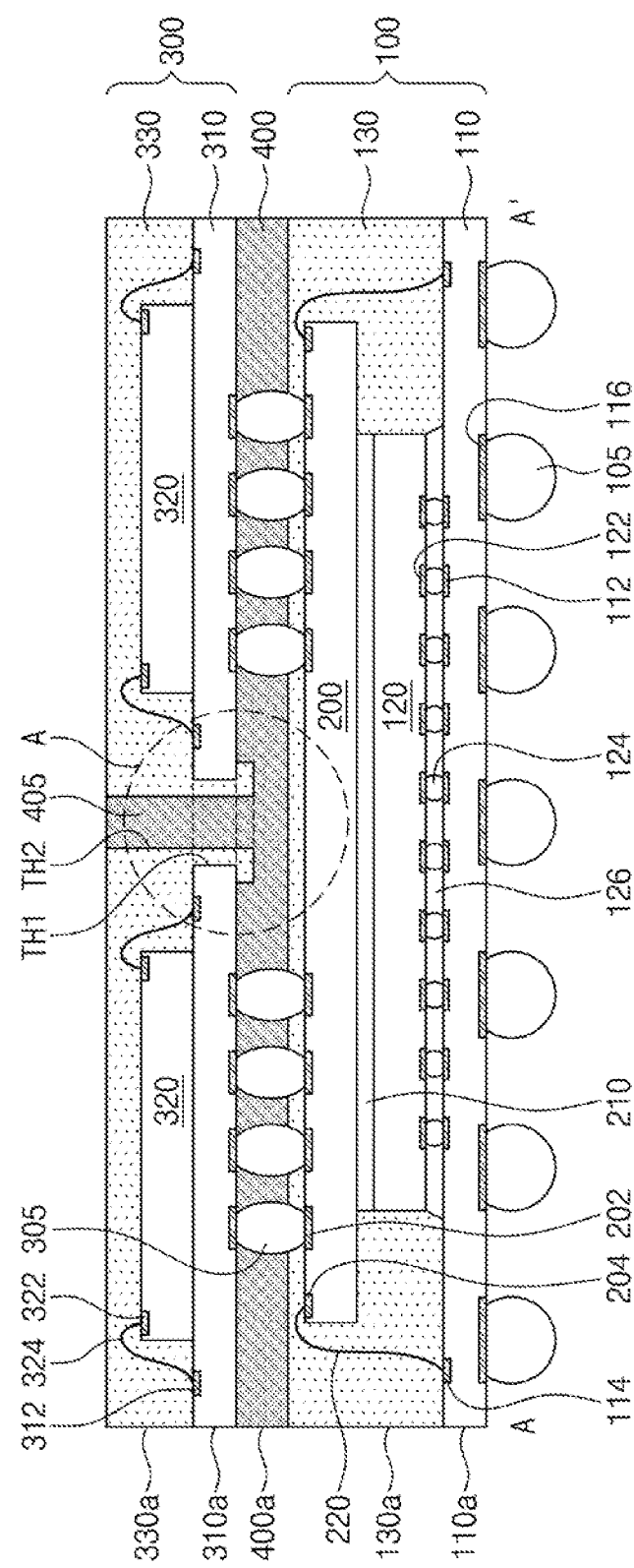
FIG. 1A illustrates a cross-sectional view showing a semiconductor package according to exemplary embodiments of the present inventive concept.
Figure 1B:
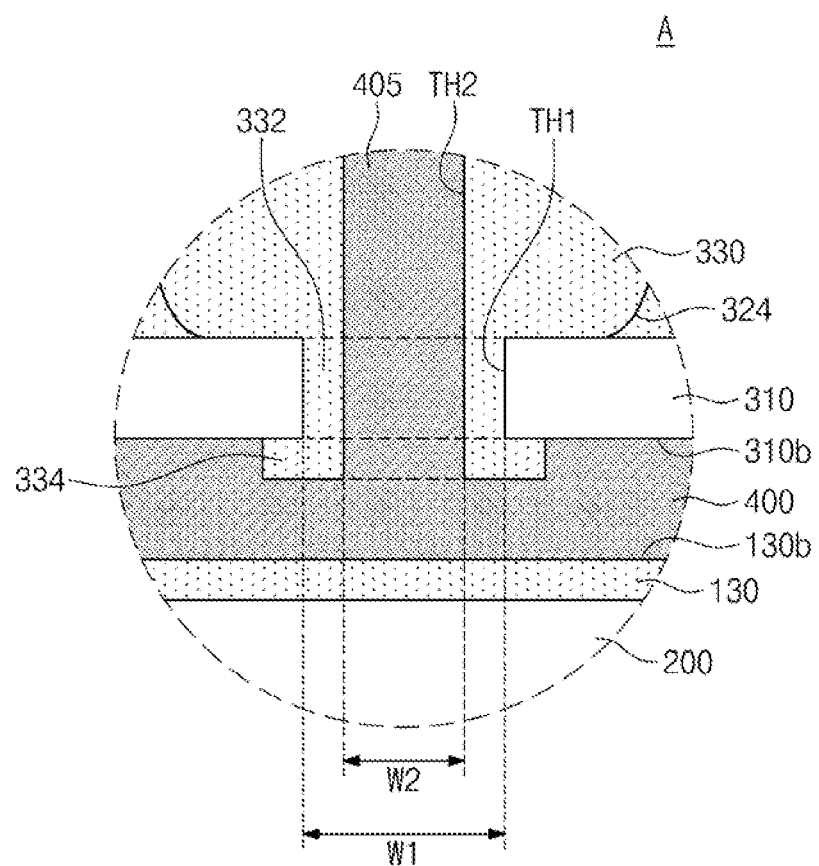
FIG. 1B illustrates an enlarged view showing section A of FIG. 1A.
Figure 1C:
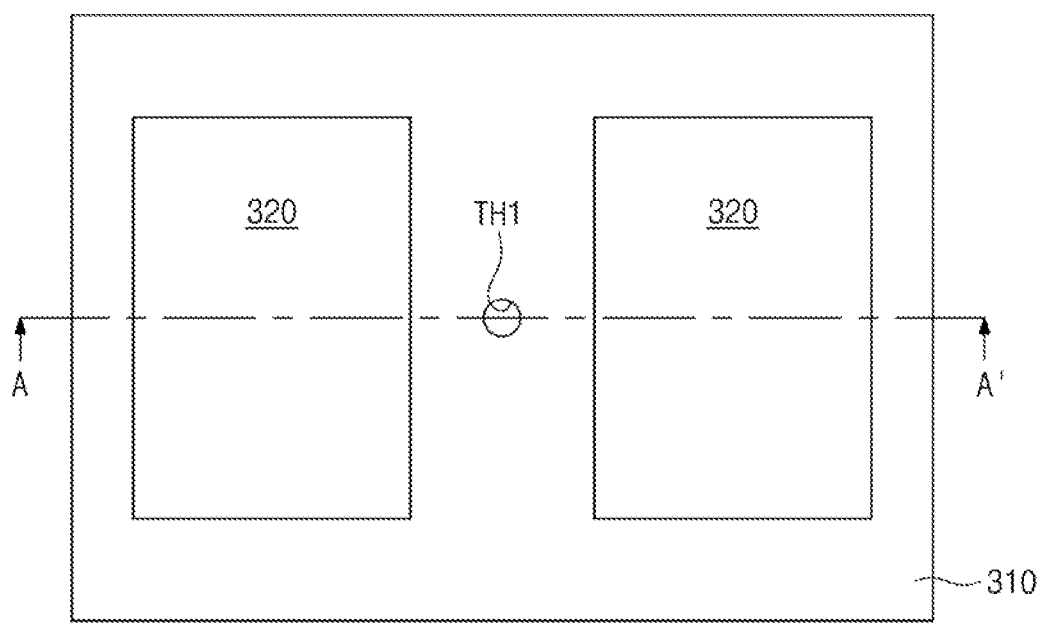
FIG. 1C illustrates a plan view showing a semiconductor package according to exemplary embodiments of the present inventive concept.
Figure 2A:
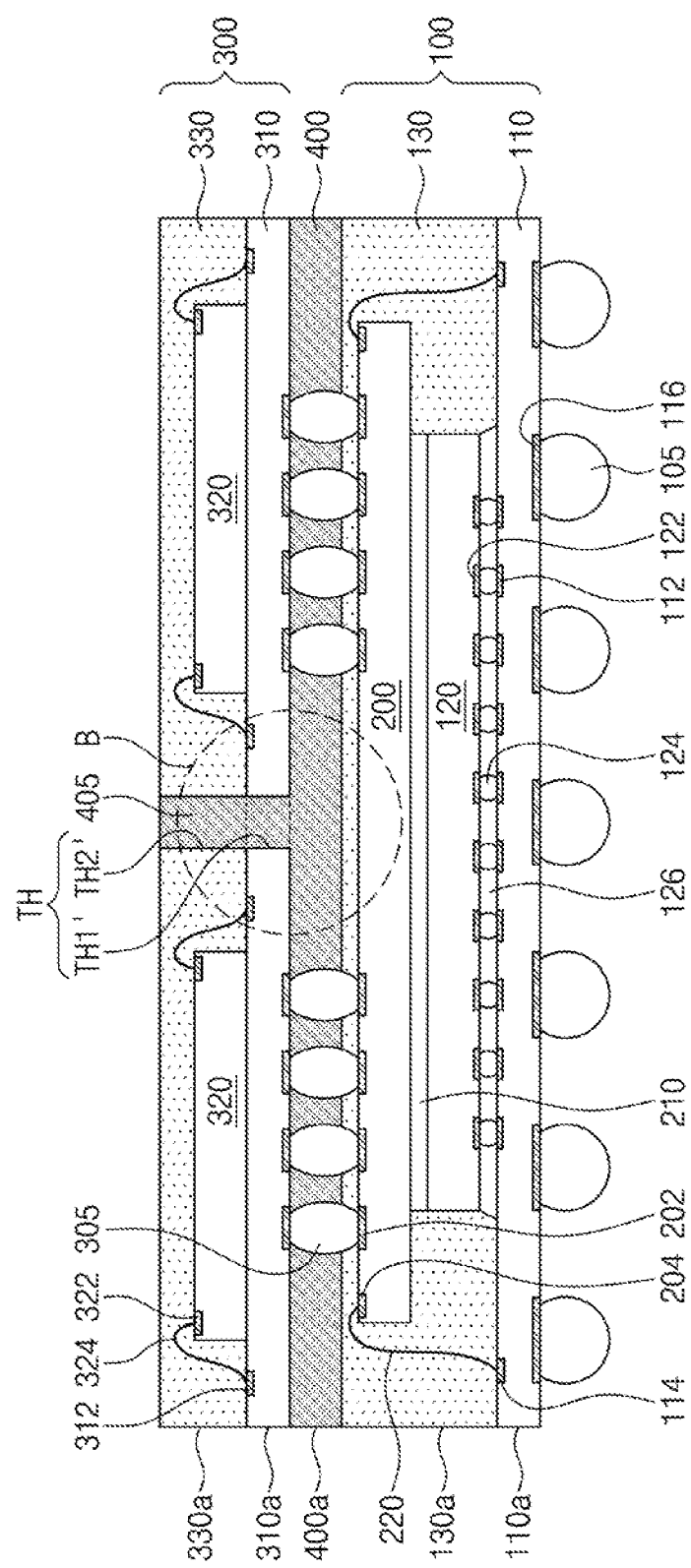
FIG. 2A illustrates a cross-sectional view showing a semiconductor package according to exemplary embodiments of the present inventive concept.
Figure 2B:
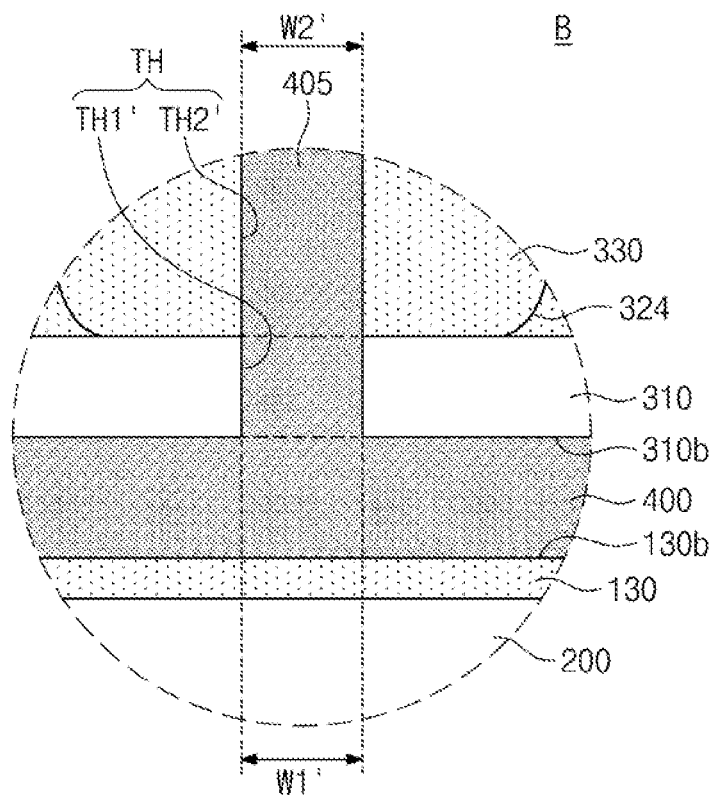
FIG. 2B illustrates an enlarged view showing section B of FIG. 2A.

FIG. 1A illustrates a cross-sectional view showing a semiconductor package according to exemplary embodiments of the present inventive concept. FIG. 1B illustrates an enlarged view showing section A of FIG. 1A. FIG. 1C illustrates a plan view showing a semiconductor package according to exemplary embodiments of the present inventive concepts, and FIG. 1A corresponds to a cross-sectional view taken along line A-A' of FIG. 1C. For convenience of description, FIG. 1C omits the illustration of an upper molding part. FIG. 2A illustrates a cross-sectional view showing a semiconductor package according to exemplary embodiments of the present inventive concept. FIG. 2B illustrates an enlarged view showing section B of FIG. 2A.

Referring to FIGS. 1A to 1C, a lower package 100 may be provided. The lower package 100 may include a lower package substrate 110, a lower semiconductor chip 120, a lower molding part 130, and an interposer substrate 200.

The lower package substrate 110 may be a printed circuit board (PCB) with signal patterns on a top surface thereof. Alternatively, the lower package substrate 110 may have a structure in which one or more dielectric layers are alternately stacked with one or more wiring line layers. The lower package substrate 110 may have, on a top surface thereof, first substrate pads 112 and second substrate pads 114.

External terminals 105 may be disposed below the lower package substrate 110. For example, the external terminals 105 may be disposed on terminal pads 116 provided on a bottom surface of the lower package substrate 110. The external terminals 105 may include solder balls or solder bumps, and based on the type of the external terminals 105, the lower package 100 may have one of a ball grid array (BGA) type, a fine ball-grid array (FBGA) type, and a land grid array (LGA) type.

The lower semiconductor chip 120 may be disposed on the lower package substrate 110. When viewed in a plan view, the lower semiconductor chip 120 may be disposed on a central portion of the lower package substrate 110. The lower semiconductor chip 120 may have a bottom surface toward the lower package substrate 110 and a top surface opposite to the bottom surface. For example, the bottom surface of the lower semiconductor chip 120 may be closer to the lower package substrate 110 than the top surface of the lower semiconductor chip 120. The bottom surface of the lower semiconductor chip 120 may be an active surface, and the top surface of the lower semiconductor chip 120 may be an inactive surface. The lower semiconductor chip 120 may be mounted on the top surface of the lower package substrate 110. For example, the lower semiconductor chip 120 may be flip-chip mounted on the lower package substrate 110. In this case, the lower semiconductor chip 120 may be electrically connected to the lower package substrate 110 through chip terminals 124, such as solder balls or solder bumps, disposed on the bottom surface of the lower semiconductor chip 120. The chip terminals 124 may be provided between the first substrate pads 112 of the lower package substrate 110 and lower chip pads 122 provided on the bottom surface of the lower semiconductor chip 120. A flux 126 may fill a space between the lower semiconductor chip 120 and the lower package substrate 110. The present inventive concept, however, is not limited thereto, and the lower semiconductor chip 120 may be mounted through bonding wires on the lower package substrate 110. In this description, the phrase "electrically connected/coupled to" may include "directly or indirectly electrically connected/coupled to." The lower semiconductor chip 120 may be, for example, a logic chip or a memory chip. The memory chip may be, for example, dynamic random access memory (DRAM), NAND flash, NOR flash, phase-change RAM (PRAM), resistive RAM (ReRAM), or magnetoresistive RAM (MRAM). Alternatively, the lower semiconductor chip 120 may be a non-memory chip, such as an application processor. The lower semiconductor chip 120 may be electrically connected through the lower package substrate 110 to the external terminals 105. FIG. 1A shows only one lower semiconductor chip 120, but the lower semiconductor chip 120 may be provided in plural.

The interposer substrate 200 may be disposed on the lower semiconductor chip 120. The interposer substrate 200 may include a dielectric substrate or a silicon substrate. The interposer substrate 200 may be attached to the top surface of the lower semiconductor chip 120. The interposer substrate 200 may have a width greater than that of the lower semiconductor chip 120. In this case, the interposer substrate 200 may protrude beyond one side of the lower semiconductor chip 120. The interposer substrate 200 may also protrude beyond two opposite sides of the lower semiconductor chip 120. Alternatively, differently from that shown in FIG. 1A, the interposer substrate 200 may have a width the same as or less than that of the lower semiconductor chip 120. The interposer substrate 200 may have, on a top surface thereof, third substrate pads 202 and fourth substrate pads 204. The interposer substrate 200 may be mounted on the lower package substrate 110. For example, the interposer substrate 200 may be wire-bonded to the lower package substrate 110. In this case, the interposer substrate 200 may be electrically connected through first bonding wires 220 to the lower package substrate 110. The first bonding wires 220 may connect the fourth substrate pads 204 on the top surface of the interposer substrate 200 to the second substrate pads 114 on the top surface of the lower package substrate 110.

An adhesive layer 210 may be provided between the lower semiconductor chip 120 and the interposer substrate 200. The adhesive layer 210 may be in contact with the top surface of the lower semiconductor chip 120 and a bottom surface of the interposer substrate 200. The adhesive layer 210 may attach the lower semiconductor chip 120 and the interposer substrate 200. Therefore, the lower semiconductor chip 120 and the interposer substrate 200 may be rigidly coupled to increase structural stability of a semiconductor package.

The lower molding part 130 may be provided on the lower package substrate 110. On the top surface of the lower package substrate 110, the lower molding part 130 may surround the lower semiconductor chip 120 and the interposer substrate 200. For example, the lower molding part 130 may cover a lateral surface of the lower semiconductor chip 120, a lateral surface of the interposer substrate 200, and the top surface of the interposer substrate 200. When the interposer substrate 200 protrudes beyond one side of the lower semiconductor chip 120, the lower molding part 130 may cover an exposed bottom surface of the interposer substrate 200. For example, the lower semiconductor chip 120 and the interposer substrate 200 may be embedded in the lower molding part 130 on the lower package substrate 110.

An upper package 300 may be provided on the lower package 100. The upper package 300 may include an upper package substrate 310, an upper semiconductor chip 320, and an upper molding part 330.

The upper package substrate 310 may be disposed on the interposer substrate 200. The upper package substrate 310 may be vertically spaced apart from the lower molding part 130. The upper package substrate 310 may have a width the same as that of the lower package substrate 110 and that of the lower molding part 130. For example, the upper package substrate 310, the lower package substrate 110, and the lower molding part 130 may have respective lateral surfaces 310a, 110a, and 130a that are positioned on the same plane. The upper package substrate 310 may be a PCB with signal patterns on a top surface thereof. Alternatively, the upper package substrate 310 may have a structure in which one or more dielectric layers are alternately stacked with one or more wiring line layers.

The upper package substrate 310 may have a first through hole TH1 that vertically penetrates therethrough. As illustrated in FIG. 1C, the first through hole TH1 may be positioned on a central portion of the upper package substrate 310. The first through hole TH1 may be placed on the lower semiconductor chip 120, and when viewed in a plan, may overlap the lower semiconductor chip 120. FIG. 1C shows only one first through hole TH1, but the present inventive concept is not limited thereto. The first through hole TH1 may be provided in plural. The first through hole TH1 may have a width W1 ranging from about 100 μm to about 200 μm.

The upper package substrate 310 may be mounted on the interposer substrate 200. For example, connection terminals 305 may be disposed below the upper package substrate 310. The connection terminals 305 may penetrate the lower molding part 130 and may be coupled to the third substrate pads 202 of the interposer substrate 200. The connection terminals 305 may include solder balls or solder bumps.

One or more upper semiconductor chips 320 may be disposed on the upper package substrate 310. When viewed in a plan, the upper semiconductor chips 320 may be spaced apart from each other. As shown in FIG. 1C, the first through hole TH1 may be positioned between the upper semiconductor chips 320. The upper semiconductor chips 320 may each have a bottom surface toward the upper package substrate 310 and a top surface opposite to the bottom surface. For example, the bottom surface of each of the upper semiconductor chips 320 may be closer to the upper package substrate 310 than the top surface of each of the upper semiconductor chips 320. The bottom surface of each upper semiconductor chip 320 may be an inactive surface, and the top surface of each upper semiconductor chip 320 may be an active surface. The upper semiconductor chips 320 may be mounted on a top surface of the upper package substrate 310. For example, the upper semiconductor chips 320 may be wire-bonded to the upper package substrate 310. In this case, the upper semiconductor chips 320 may be electrically connected through second bonding wires 324 to the upper package substrate 310. The second bonding wires 324 may connect fifth substrate pads 312 provided on the top surface of the upper package substrate 310 to upper chip pads 322 provided on the top surfaces of the upper semiconductor chips 320. The upper semiconductor chips 320 may each be attached through an upper adhesive layer to the top surface of the upper package substrate 310. The present inventive concept, however, is not limited thereto, and the upper semiconductor chips 320 may be flip-chip mounted on the upper package substrate 310. The upper semiconductor chips 320 may be, for example, logic chips or memory chips. The upper semiconductor chips 320 may be electrically connected through the upper package substrate 310 and the interposer substrate 200 to the external terminals 105 of the lower package substrate 110. FIG. 1A shows two upper semiconductor chips 320, but one or three or more upper semiconductor chips 320 may be provided.

The upper molding part 330 may be provided on the upper package substrate 310. On the top surface of the upper package substrate 310, the upper molding part 330 may surround the upper semiconductor chips 320. For example, the upper semiconductor chips 320 may be embedded in the upper molding part 330 on the upper package substrate 310.

The upper molding part 330 may have a second through hole TH2 that vertically penetrates therethrough. When viewed in a plan, the second through hole TH2 may be positioned on a central portion of the upper molding part 330. The second through hole TH2 may be placed between the upper semiconductor chips 320. The second through hole TH2 may have a width W2 ranging from about 100 μm to about 200 μm. When viewed in a plan, the second through hole TH2 may overlap the first through hole TH1. The width W2 of the second through hole TH2 may be less than the width W1 of the first through hole TH1, and the second through hole TH2 may extend into the first through hole TH1. For example, the upper molding part 330 may include a first segment 332 that extends along an inner wall of the first through hole TH1 of the upper package substrate 310, and the second through hole TH2 may have an inner wall that is spaced apart from the inner wall of the first through hole TH1. For example, the inner wall of the second through hole TH2 may be spaced apart from the inner wall of the first through hole TH1 by the segment 332. In addition, the inner wall of the second through hole TH2 may be located inside of the first through hole TH1. For example, the upper molding part 330 may extend into the first through hole TH1 of the upper package substrate 310, and when viewed in a plan, the second through hole TH2 of the upper molding part 330 may be positioned in the inside of the first through hole TH1.

The upper molding part 330 may extend onto a bottom surface 310b of the upper package substrate 310. For example, the upper molding part 330 may have a second segment 334 that extends from a bottom end of the first segment 332 and along the bottom surface 310b of the upper package substrate 310. In this case, the second segment 334 of the upper molding part 330 may protrude downwardly from the bottom surface 310b of the upper package substrate 310. In other words, the second segment 334 of the upper molding part 330 may be disposed below the bottom surface 310b of the upper package substrate 310. The second segment 334 of the upper molding part 330 may cover a portion of the bottom surface 310b of the upper package substrate 310.

In exemplary embodiments of the present inventive concept, the upper package substrate 310 and the upper molding part 330 may share a single through hole TH. For example, as illustrated in FIGS. 2A and 2B, the through hole TH may include a first through hole TH1' that penetrates the upper package substrate 310 and a second through hole TH2' that penetrates the upper molding part 330. The first and second through holes TH1' and TH2' may have the same shape when viewed in a plan. The first and second through holes TH1' and TH2' may be spatially connected to each other. The first through hole TH1' may have a width W1' the same as a width W2' of the second through hole TH2'. In this case, the first through hole TH1' may overlap the second through hole TH2', and the first through hole TH1' may have an inner wall that is coplanar with that of the second through hole TH2'. For example, the first and second through holes TH1' and TH2' may be spatially connected to have the same planar shape. In this case, the upper molding part 330 may not extend into the first through hole TH1'. The following description refers back to the embodiment of FIGS. 1A and 1B.

An under-fill part 400 may be provided between the upper package 300 and the lower package 100. The under-fill part 400 may fill a space between the upper package substrate 310 and the lower molding part 130. The under-fill part 400 may be in contact with the connection terminals 305. For example, the under-fill part 400 may contact opposite sides of individual connection terminals 305. The under-fill part 400 may have a lateral surface 400a coplanar with the lateral surface 110a of the lower package substrate 110, the lateral surface 130a of the lower molding part 130, the lateral surface 310a of the upper package substrate 310, and a lateral surface 330a of the upper molding part 330. The under-fill part 400 may be in contact with a top surface 130b of the lower molding part 130 and the bottom surface 310b of the upper package substrate 310. The under-fill part 400 may have an extension segment 405 that extends from between the lower package 100 and the upper package 300 to penetrate the upper package substrate 310 and the upper molding part 330. The extension segment 405 may fill the first and second through holes TH1 and TH2. In the first through hole TH1, the extension segment 405 may be spaced apart from the inner wall of the first through hole TH1 by the first segment 332 of the upper molding part 330. For example, the extension segment 405 may penetrate the first and second segments 332 and 334 of the upper molding part 330, wherein the first segment 332 fills the first through hole TH1, and may extend toward a top surface of the upper molding part 330. The under-fill part 400 may include a dielectric material whose thermal expansion coefficient is different from those of the lower and upper packages 100 and 300. The under-fill part 400 may include an epoxy molding compound (EMC).

As illustrated in FIGS. 2A and 2B, when the first and second through holes TH1' and TH2' have the same planar shape, the extension segment 405 of the under-fill part 400 may be in contact with the inner wall of the first through hole TH1' and also with the inner wall of the second through hole TH2'. The following description will return to the embodiment of FIG. 1A.

In general, one or both of the lower and upper packages 100 and 300 may suffer from warpage caused by heat generated when a semiconductor package is fabricated or used. For example, one or both of the lower and upper packages 100 and 300 may be warped to have a concavely U-shape like a smiling face or a convex upside down U-shape like a sad face at their center.

The warpage of a semiconductor package may be alleviated by the under-fill part 400 that fills a space between the lower and upper packages 100 and 300. The under-fill part 400 may have a thermal expansion coefficient different from those of the lower and upper packages 100 and 300. The under-fill part 400 may have a thermal expansion coefficient that is capable of compensating warpage of one or both of the lower and upper packages 100 and 300. For example, the under-fill part 400 may compensate for a difference in a thermal expansion coefficient between upper and lower portions of a semiconductor package. As a result, a semiconductor package according to exemplary embodiments of the present inventive concept is less susceptible to warpage due to heat, thereby increasing its structural stability.

In exemplary embodiments of the inventive concept, the under-fill part 400 may include a dielectric material whose thermal conductivity is high. For example, the under-fill part 400 may include an acryl-based polymer, an epoxy-based polymer, or a urethane-based polymer. Alternatively, the under-fill part 400 may include a thermal interface material (TIM), such as thermal grease. Therefore, the under-fill part 400 may efficiently radiate heat generated from the lower semiconductor chip 120. The under-fill part 400 may penetrate the upper package 300 and be exposed on a top surface of the upper package 300, and thus, heat generated from the lower and upper semiconductor chips 120 and 320 may be easily discharged from a semiconductor package. As a result, a semiconductor package according to exemplary embodiments of the present inventive concept increases heat radiation efficiency. Further, the under-fill part 400 may attach the upper package 300 and the interposer substrate 200.

Figure 3:
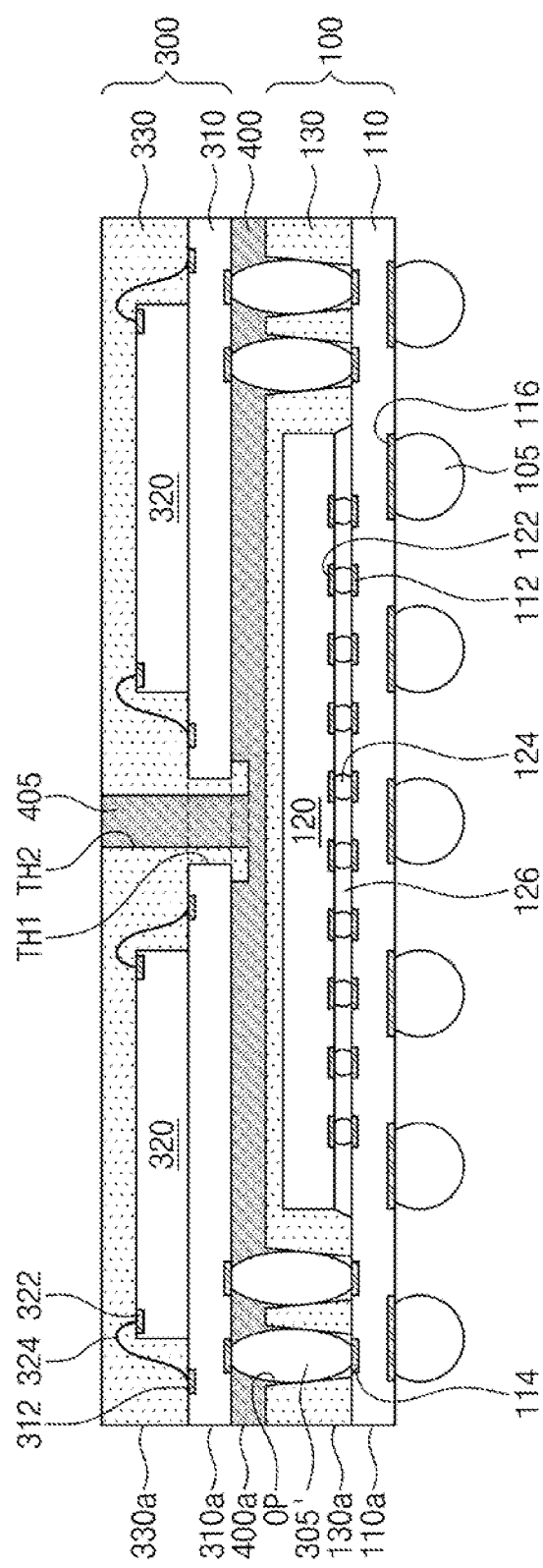
FIG. 3 illustrates a cross-sectional view showing a semiconductor package according to exemplary embodiments of the present inventive concept.

FIG. 3 illustrates a cross-sectional view showing a semiconductor package according to exemplary embodiments of the present inventive concept. In the embodiments that follow, components the same as those discussed with reference to FIGS. 1A and 1B may have the same reference numerals allocated thereto, and thus, a repetitive explanation thereof will be omitted or abridged for convenience of description. The following mainly describes differences between the embodiment of FIGS. 1A and 1B and other embodiments.

Referring to FIG. 3, a semiconductor package may not include an interposer substrate. For example, the interposer substrate 200 of FIG. 1A may not be provided.

A lower package 100 may be provided. The lower package 100 may include a lower package substrate 110, a lower semiconductor chip 120, and a lower molding part 130.

The lower molding part 130 may be provided on the lower package substrate 110. On a top surface of the lower package substrate 110, the lower molding part 130 may surround the lower semiconductor chip 120. For example, the lower molding part 130 may cover lateral and top surfaces of the lower semiconductor chip 120.

An upper package 300 may be provided on the lower package 100. The upper package 300 may include an upper package substrate 310, an upper semiconductor chip 320, and an upper molding part 330.

The upper package substrate 310 may be disposed on the lower molding part 130. In this case, the upper package substrate 310 may be vertically spaced apart from the lower molding part 130. The upper package substrate 310 may have a first through hole TH1 that vertically penetrates therethrough. The first through hole TH1 may be positioned on a central portion of the upper package substrate 310. The first through hole TH1 may be placed on the lower semiconductor chip 120, and when viewed in a plan, may overlap the lower semiconductor chip 120.

The upper package substrate 310 may be mounted on the lower package substrate 110. For example, connection terminals 305' may be disposed below the upper package substrate 310. When viewed in a plan, the connection terminals 305' may be placed outside the lower semiconductor chip 120. For example, the connection terminals 305' may be disposed on opposite sides of the lower semiconductor chip 120. The connection terminals 305' may be spaced apart from the lateral surface of the lower semiconductor chip 120. The connection terminals 305' may be arranged in an opening OP formed in the lower molding part 130. The opening OP may vertically penetrate the lower molding part 130 to expose second substrate pads 114 of the lower package substrate 110. For example, the connection terminals 305' may penetrate the lower molding part 130 and may connect with the second substrate pads 114 of the lower package substrate 110. The lower molding part 120 may be disposed between the connection terminals 305' and the lateral surface of the lower semiconductor chip 120.

One or more upper semiconductor chips 320 may be disposed on the upper package substrate 310. The first through hole TH1 may be positioned between the upper semiconductor chips 320.

The upper molding part 330 may be provided on the upper package substrate 310. On a top surface of the upper package substrate 310, the upper molding part 330 may cover the upper semiconductor chips 320. The upper molding part 330 may have a second through hole TH2 that vertically penetrates therethrough. The second through hole TH2 may be placed between the upper semiconductor chips 320 and may be spatially connected to the first through hole TH1. The first and second through holes TH1 and TH2 may each have a shape the same as or similar to that discussed with reference to FIG. 1A or 2A.

An under-fill part 400 may be provided between the upper package 300 and the lower package 100. The under-fill part 400 may fill a space between the upper package substrate 310 and the lower molding part 130. The under-fill part 400 may be in contact with the connection terminals 305'. The under-fill part 400 may have a lateral surface 400a coplanar with those of the lower package substrate 110 (e.g., 110a), the lower molding part 130 (e.g., 130a), the upper package substrate 310 (e.g., 310a), and the upper molding part 330 (e.g., 330a). The under-fill part 400 may have an extension segment 405 that extends from between the lower package 100 and the upper package 300 to penetrate the upper package substrate 310 and the upper molding part 330. The extension segment 405 may fill the first and second through holes TH1 and TH2.

The configuration of the semiconductor package without an interposer substrate has been explained with reference to FIG. 3. The present inventive concept, however, is not limited thereto, and the lower package included in the semiconductor package of FIG. 3 may be variously changed in shape. For example, the lower package may include a fan-out type semiconductor package.

Figure 4:
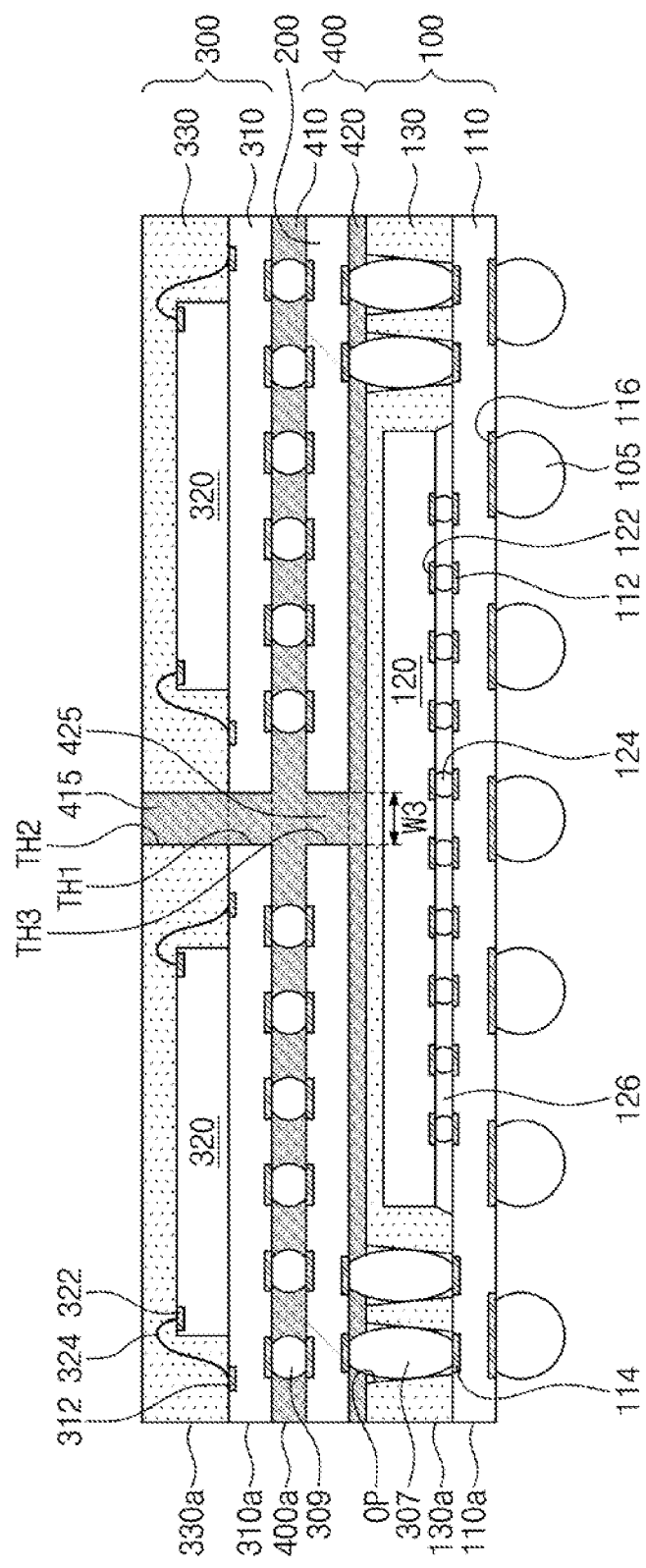
FIG. 4 illustrates a cross-sectional view showing a semiconductor package according to exemplary embodiments of the present inventive concept.

FIG. 4 illustrates a cross-sectional view showing a semiconductor package according to exemplary embodiments of the present inventive concept.

Referring to FIG. 4, an interposer substrate 200 may be disposed on a lower package 100.

The interposer substrate 200 may be placed on a lower molding part 130. The interposer substrate 200 may be vertically spaced apart from the lower molding part 130. The interposer substrate 200 may have a third through hole TH3 that vertically penetrates therethrough. The third through hole TH3 may be positioned on a central portion of the interposer substrate 200. The third through hole TH3 may be placed on a lower semiconductor chip 120, and when viewed in a plan, may overlap the lower semiconductor chip 120. The third through hole TH3 may have a width W3 ranging from about 100 μm to about 200 μm.

The interposer substrate 200 may be mounted on a lower package substrate 110. For example, first connection terminals 307 may be disposed below the interposer substrate 200. When viewed in a plan, the first connection terminals 307 may be positioned outside the lower semiconductor chip 120. For example, the first connection terminals 307 may be disposed on opposite sides of the lower semiconductor chip 120. The first connection terminals 307 may be put into an opening OP formed in the lower molding part 130. The first connection terminals 307 may penetrate the lower molding part 130 and may connect with second substrate pads 114 of the lower package substrate 110.

An upper package 300 may be provided on the interposer substrate 200. The upper package 300 may include an upper package substrate 310, upper semiconductor chips 320, and an upper molding part 330.

The upper package substrate 310 may be disposed on the interposer substrate 200. The upper package substrate 310 may be vertically spaced apart from the interposer substrate 200. The upper package substrate 310 may have a first through hole TH1 that vertically penetrates therethrough. The first through hole TH1 may be positioned on a central portion of the upper package substrate 310. The first through hole TH1 may be placed on the lower semiconductor chip 120, and when viewed in a plan, may overlap the lower semiconductor chip 120.

The upper package substrate 310 may be mounted on the interposer substrate 200. For example, second connection terminals 309 may be disposed below the upper package substrate 310. The second connection terminals 309 may be coupled to substrate pads of the interposer substrate 200, and may electrically connect the interposer substrate 200 and the upper package substrate 310.

One or more upper semiconductor chips 320 may be disposed on the upper package substrate 310. The first through hole TH1 may be positioned between the upper semiconductor chips 320.

The upper molding part 330 may be provided on the upper package substrate 310. On a top surface of the upper package substrate 310, the upper molding part 330 may cover the upper semiconductor chips 320. The upper molding part 330 may have a second through hole TH2 that vertically penetrates therethrough. The second through hole TH2 may be placed between the upper semiconductor chips 320 and spatially connected to the first through hole TH1. The first and second through holes TH1 and TH2 may each have a shape the same as or similar to that discussed with reference to FIG. 1A or 2A.

An under-fill part 400 may be provided between the upper package 300 and the lower package 100. The under-fill part 400 may include a first under-fill part 410 that fills a space between the upper package 300 and the interposer substrate 200 and a second under-fill part 420 that fills a space between the interposer substrate 200 and the lower package 100. Herein, the first and second under-fill parts 410 and 420 are arbitrarily divided for convenience of description, and are formed of substantially the same material to constitute a single unitary component.

The first under-fill part 410 may fill a space between the upper package substrate 310 and the interposer substrate 200. The first under-fill part 410 may encapsulate the second terminal terminals 309 between the upper package substrate 310 and the interposer substrate 200. The first under-fill part 410 may have a first extension segment 415 that extends from between the interposer substrate 200 and the upper package 300 to penetrate the upper package substrate 310 and the upper molding part 330. The first extension segment 415 may fill the first and second through holes TH1 and TH2.

The second under-fill part 420 may fill a space between the interposer substrate 200 and the lower molding part 130. The second under-fill part 420 may encapsulate the first connection terminals 307 between the interposer substrate 200 and the lower molding part 130. For example, the second under-fill part 420 may encapsulate upper portions of the first connection terminals 307. The second under-fill part 420 may have a second extension segment 425 that extends from between the interposer substrate 200 and the lower package 100 to penetrate the interposer substrate 200. The second extension segment 425 may fill the third through hole TH3. The second extension segment 425 may penetrate the third through hole TH3 and may connect with the first under-fill part 410.

According to exemplary embodiments of the present inventive concept, the under-fill part 400 may fill a space between the lower package 100 and the interposer substrate 200 and also fill a space between the upper package 300 and the interposer substrate 200. The second extension segment 425 connects the first under-fill part 410 filling the space between the lower package 100 and the interposer substrate 200 to the second under-fill part 420 filling the space between the upper package 300 and the interposer substrate 200. Therefore, the under-fill part 400 may rigidly attach the lower package 100, the interposer substrate 200, and the upper package 300, such that a semiconductor package may have increased structural stability.

FIGS. 5 to 10 illustrate cross-sectional views showing a method of fabricating a semiconductor package according to exemplary embodiments of the present inventive concept.

Figure 5:
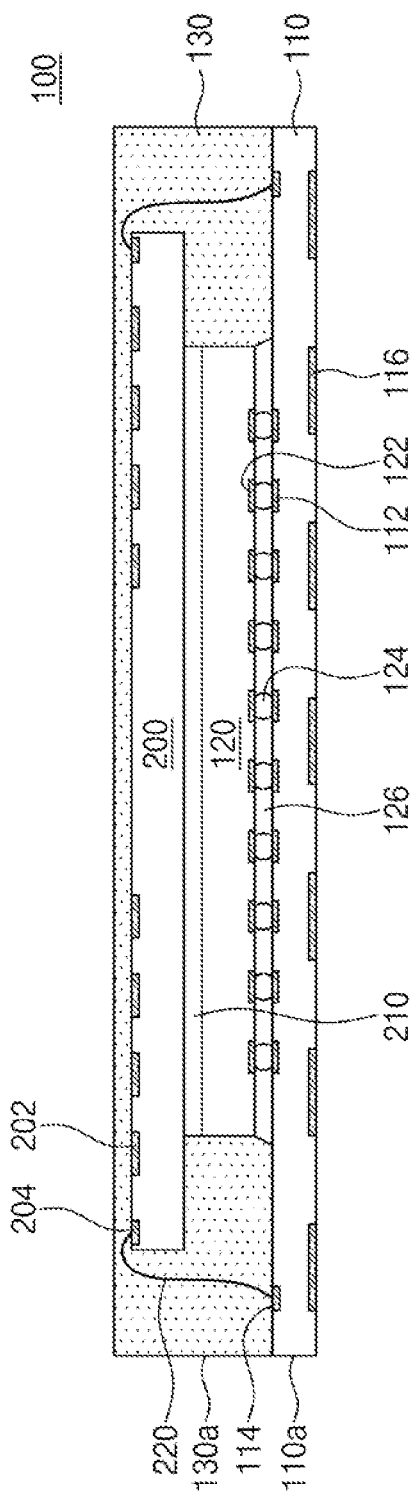
FIGS. 5, 6, 7, 8, 9 and 10 illustrate cross-sectional views showing a method of fabricating a semiconductor package according to exemplary embodiments of the present inventive concept.

Referring to FIG. 5, a lower package 100 may be manufactured. The lower package 100 may be configured identically or similarly to that discussed with reference to FIGS. 1A and 1B. For example, a lower semiconductor chip 120 may be mounted on a lower package substrate 110. For example, the lower semiconductor chip 120 may be flip-chip mounted on the lower package substrate 110. An interposer substrate 200 may be attached to a top surface of the lower semiconductor chip 120. The interposer substrate 200 may be attached through an adhesive layer 210 to the lower semiconductor chip 120. The interposer substrate 200 may be mounted on the lower package substrate 110. The interposer substrate 200 may be wire-bonded to the lower package substrate 110. For example, first bonding wires 220 may be used to connect fourth substrate pads 204 of the interposer substrate 200 to second substrate pads 114 of the lower package substrate 110. A lower molding part 130 may be formed on the lower package substrate 110. For example, a molding member may be coated on the lower package substrate 110. The molding member may cover the lower semiconductor chip 120 and the interposer substrate 200. The molding member may be cured to form the lower molding part 130.

Figure 6:
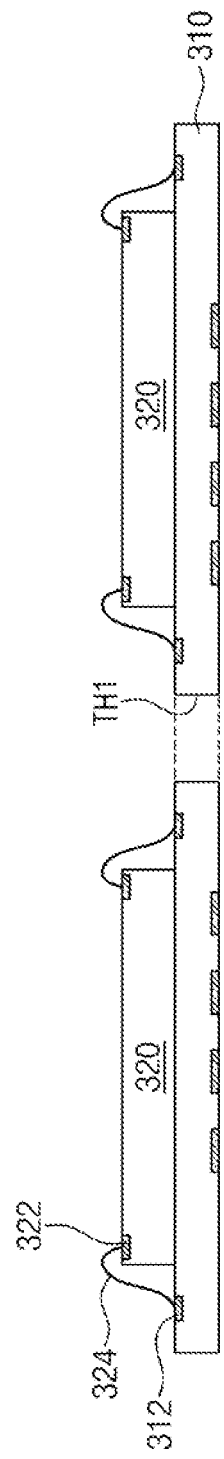

Referring to FIG. 6, an upper package substrate 310 may be provided. The upper package substrate 310 may undergo a first process to form a first through hole TH1. For example, the first process may include mechanical drilling. When viewed in a plan, the first through hole TH1 may be positioned on a central portion of the upper package substrate 310. The first through hole TH1 may have a width ranging from about 100 µm to about 200 µm. When the width of the first through hole TH1 is less than 100 µm, it an under-fill member (see 430 of FIG. 10) may not be easily injected in a subsequent process.

Upper semiconductor chips 320 may be mounted on the upper package substrate 310. The upper semiconductor chips 320 may be spaced apart from the first through hole TH1. The upper semiconductor chips 320 may be wire-bonded to the upper package substrate 310. In exemplary embodiments of the present inventive concept, the first process to form the first through hole TH1 may be performed after the upper semiconductor chips 320 are mounted on the upper package substrate 310.

Figure 7:
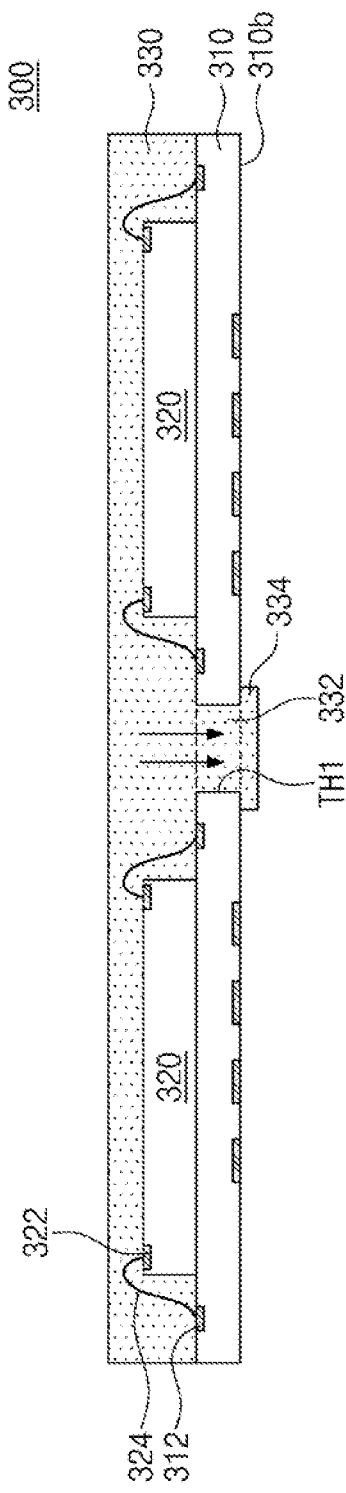

Referring to FIG. 7, an upper molding part 330 may be formed on the upper package substrate 310. For example, a molding member may be coated on the upper package substrate 310. The molding member may cover the upper package substrate 310 and the upper semiconductor chips 320. At this stage, as indicated by downward arrows in FIG. 7, the molding member may be introduced into the first through hole TH1. For example, a portion of the molding member may fill the first through hole TH1, or may pass through the first through hole TH1 and then flow onto a bottom surface 310b of the upper package substrate 310. For example, a portion of the molding member may overlap the bottom surface 310b of the upper package substrate 310 at opposite sides of the first through hole TH1.

The molding member may be cured to form the upper molding part 330. A first segment 332 (see also FIG. 1A) of the upper molding part 330 may fill the first through hole TH1, or a second segment 334 (see also FIG. 1A) of the upper molding part 330 may protrude onto the bottom surface 310b of the upper package substrate 310. An upper package 300 may thus be formed.

In exemplary embodiments of the present inventive concept, the molding member may fill the first through hole TH1, but may not flow onto the bottom surface 310b of the upper package substrate 310. For example, the upper molding part 330 may not protrude onto the bottom surface 310b of the upper package substrate 310.

Figure 8:
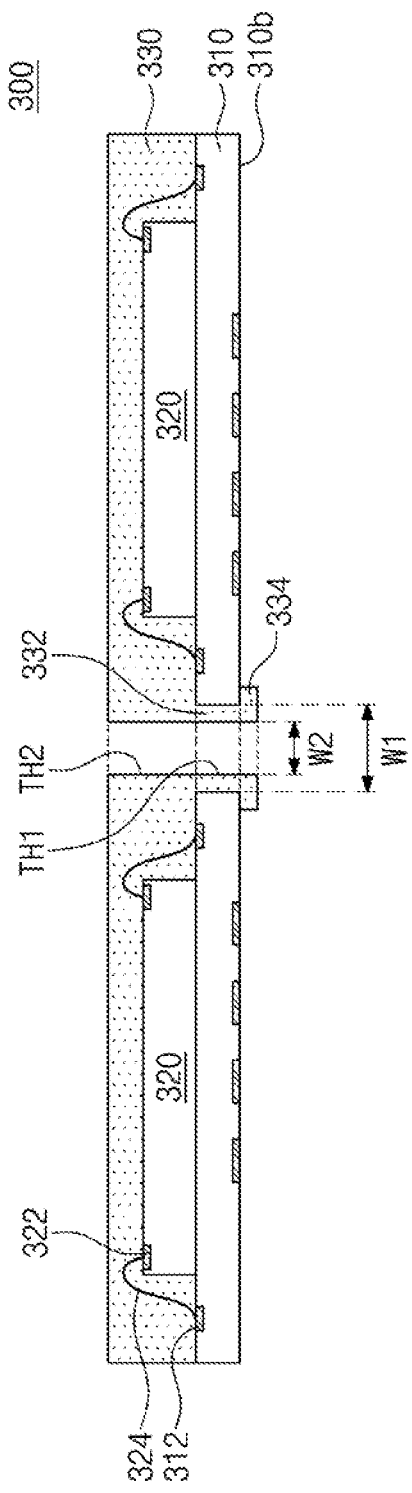

Referring to FIG. 8, the upper molding part 330 may undergo a second process to form a second through hole TH2. For example, the second process may include laser drilling or mechanical drilling. The second through hole TH2 may have a width less than that of the first through hole TH1. The second through hole TH2 may have a width ranging from about 100 µm to about 200 µm. When viewed in a plan, the second through hole TH2 may be formed to lie inside the first through hole TH1. For example, the second process may be performed on an upper portion of the upper molding part 330 and also on the first and second segments 332 and 334 of the upper molding part 330, wherein the first segment 332 fills the first through hole TH1.

Figure 9:
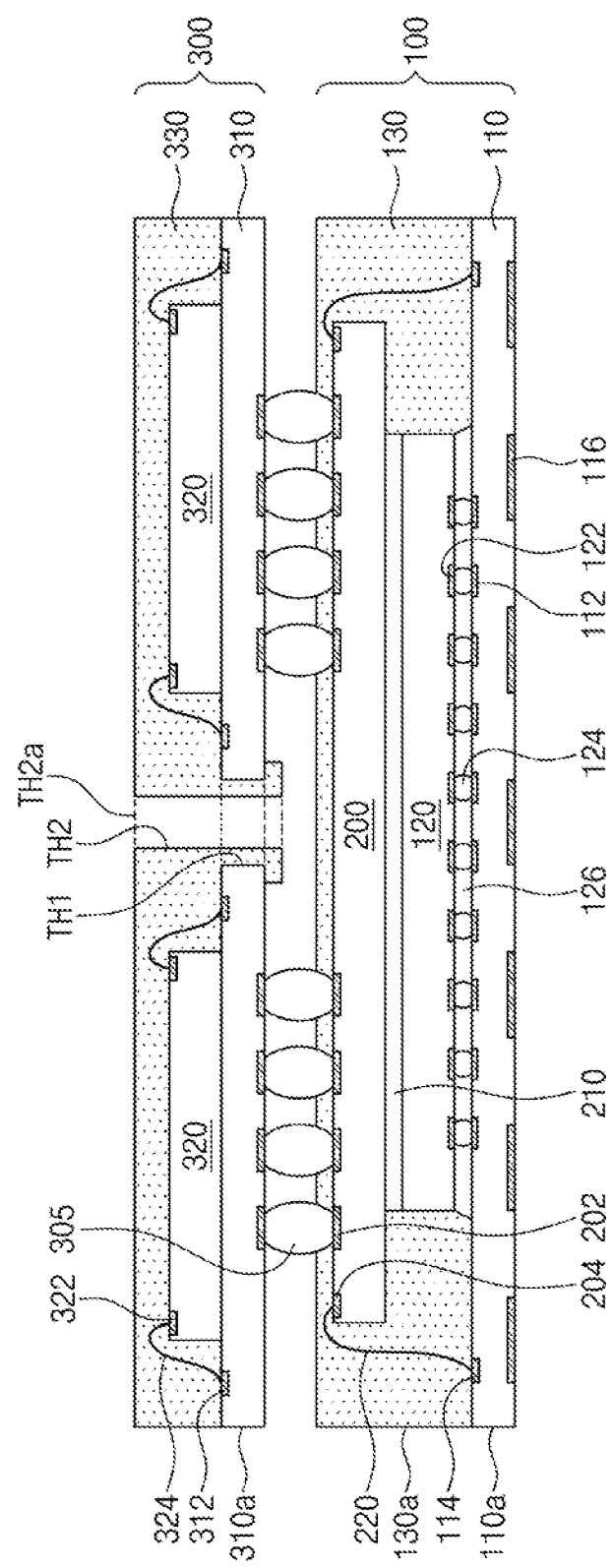

Referring to FIG. 9, the upper package 300 may be mounted on the lower package 100. The upper package 300 may be aligned onto the lower package 100. Connection terminals 305 may be provided between the upper package 300 and the lower package 100. The connection terminals 305 may include solder balls or solder bumps. The connection terminals 305 may be provided in openings of the lower molding part 130 that expose third substrate pads 202 of the interposer substrate 200. Afterwards, the connection terminals 305 may undergo a reflow process to mount the upper package substrate 310 on the interposer substrate 200. In this case, the upper package substrate 310 may be spaced apart from a top surface of the lower molding part 130. For example, the upper package substrate 310 may be spaced apart from a top surface of the lower molding part 130 by the connection terminals 305.

Figure 10:
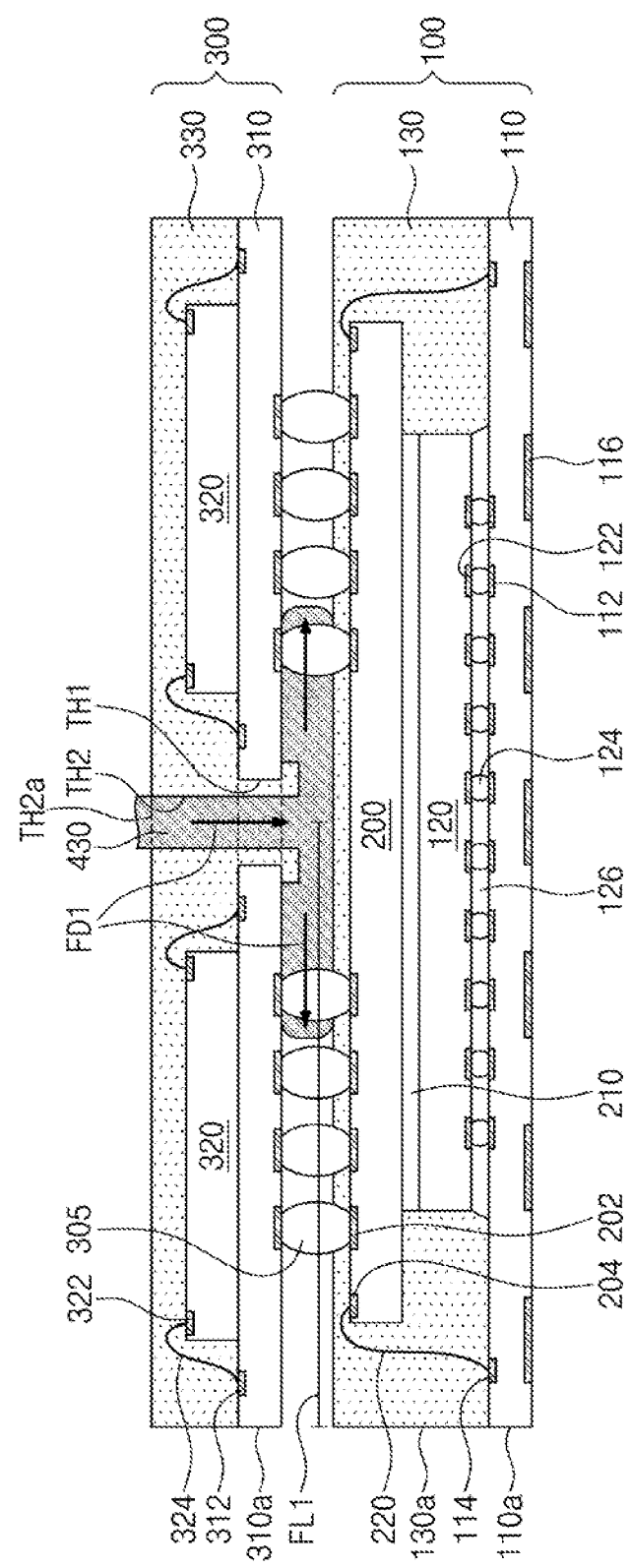

Referring to FIG. 10, an under-fill part (see 400 of FIG. 1A) may be formed between the upper package 300 and the lower package 100. For example, an under-fill member 430 may fill a space between the upper package 300 and the lower package 100. For example, as indicated by arrows in FIG. 10, the under-fill member 430 may be externally introduced into the second through hole TH2 of the upper molding part 330. A flow direction FD1 of the under-fill member 430 may pass through the second through hole TH2 and the first through hole TH1. For example, the under-fill member 430 may flow through the second through hole TH2 and the first through hole TH1 to a space between the upper package substrate 310 and the lower molding part 130, and then, flow outwardly from that space.

When a semiconductor package is fabricated as illustrated in FIG. 4, the under-fill member 430 may flow through the second through hole TH2 and the first through hole TH1 to fill a space between the upper package 300 and the interposer substrate 200. The under-fill member 430 may flow through the third through hole TH3 to fill a space between the interposer substrate 200 and the lower package 100.

According to exemplary embodiments of the present inventive concept, because the second through hole TH2 is formed on a central portion of the upper package 300, the under-fill member 430 may have a reduced flow length FL1. Therefore, the under-fill member 430 may have low resistance to flow, may easily flow, and may be prevented from overflowing caused by resistance to flow of the under-fill member 430 at an entrance TH2a of the second through hole TH2. Thus, the under-fill member 430 may be prevented from being unnecessarily used. Moreover, the easy introduction of the under-fill member 430 may reduce the creation of voids, such as air gaps, between the upper package substrate 310 and the lower molding part 130.

The introduction of the under-fill member 430 may continue until the under-fill member 430 completely fills a space between the upper package substrate 310 and the lower molding part 130. For example, the under-fill member 430 may flow toward a lateral surface of a semiconductor package, e.g., toward a lateral surface 310a of the upper package substrate 310 and a lateral surface 130a of the lower molding part 130. When the under-fill member 430 reaches the lateral surface of the semiconductor package, the introduction of the under-fill member 430 may stop. Therefore, the under-fill member 430 may be prevented from flowing outside the semiconductor package, and as a result, it is possible to avoid unnecessary consumption of the under-fill member 430. The under-fill member 430 may completely fill a space between the upper package substrate 310 and the lower molding part 130 and may encapsulate the connection terminals 305.

Figure 11:
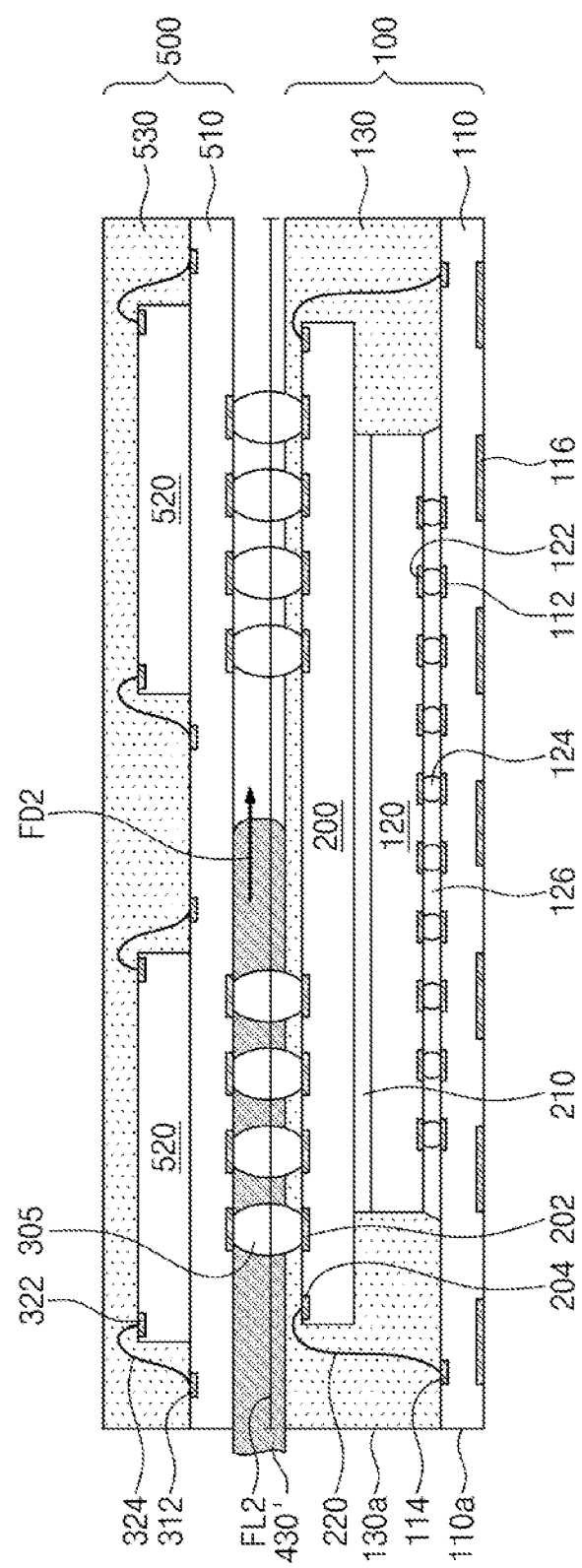
FIG. 11 illustrates a cross-sectional view showing a method of fabricating a semiconductor package whose upper package includes neither first nor second through holes.

When neither the first through hole TH1 nor the second through hole TH2 is formed on the upper package 300, voids may occur between the upper package 300 and the lower package 100. FIG. 11 illustrates a cross-sectional view showing a method of fabricating a semiconductor package whose upper package includes neither first nor second through holes.

Referring to FIG. 11, no first through hole may be included in an upper package substrate 510 of an upper package 500 including upper semiconductor chips 520, and no second through hole may be included in an upper molding part 530 of the upper package 500. As indicated by arrows in FIG. 11, an under-fill member 430' may be externally introduced into a space between the upper package substrate 510 and the lower molding part 130. A flow direction FD2 of the under-fill member 430' may go from one side to another side of a semiconductor package. In this case, the under-fill member 430' may have an increased flow length FL2 and high resistance to flow. The under-fill member 430' may thus overflow at one side of a semiconductor package, e.g., the side serving as an entrance through which the under-fill member 430' is introduced, and voids such as air gaps may occur between the upper package substrate 510 and the lower molding part 130.

Referring back to FIG. 1A, a curing process may be performed on the under-fill member 430 of FIG. 10. The under-fill member 430 may be cured to form an under-fill part 400. Thereafter, external terminals 105 may be formed on a bottom surface of the lower package substrate 110.

Through the processes above, a semiconductor package may be fabricated as shown in FIG. 1A.

Figure 12:
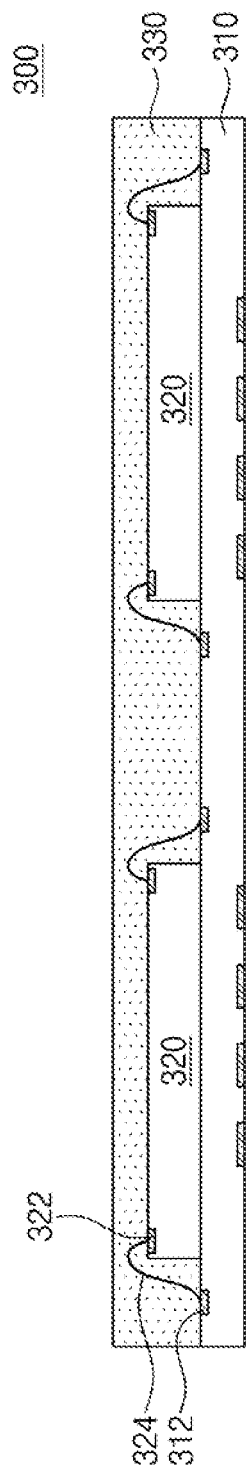
FIGS. 12, 13 and 14 illustrate cross-sectional views showing a method of fabricating a semiconductor package according to exemplary embodiments of the present inventive concept.
Figure 13:
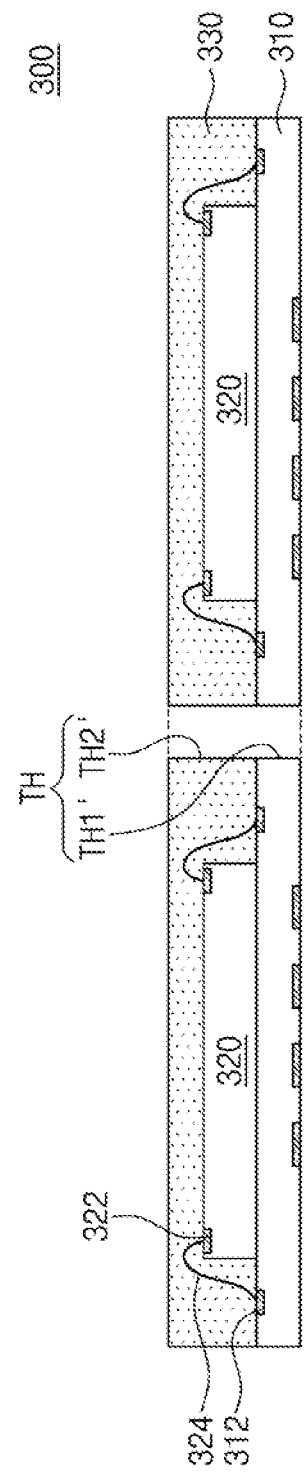
Figure 14:
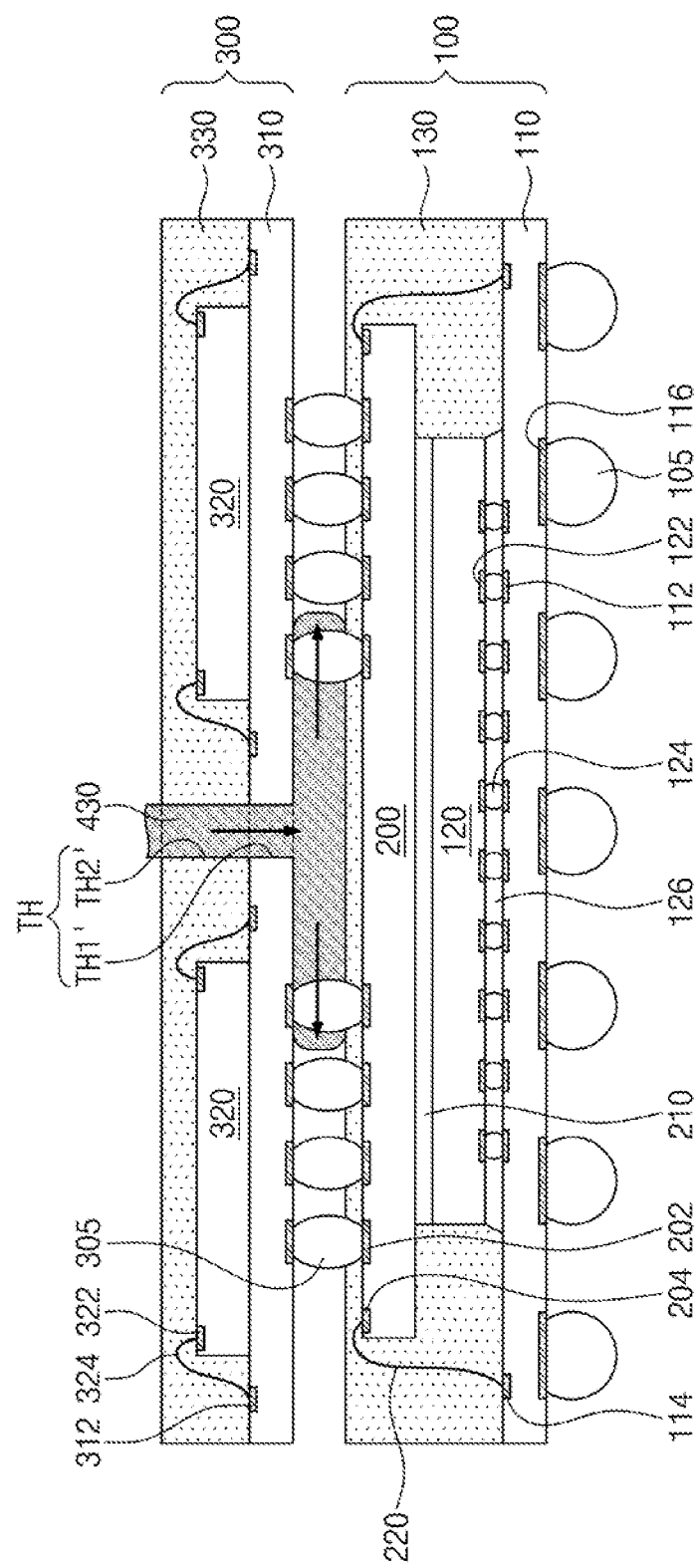

FIGS. 12 to 14 illustrate cross-sectional views showing a method of fabricating a semiconductor package according to exemplary embodiments of the present inventive concept.

Referring to FIG. 12, an upper package substrate 310 may be provided.

Upper semiconductor chips 320 may be mounted on the upper package substrate 310. The upper semiconductor chips 320 may be disposed spaced apart from each other. The upper semiconductor chips 320 may be wire-bonded to the upper package substrate 310.

An upper molding part 330 may be formed on the upper package substrate 310. For example, a molding member may be coated on the upper package substrate 310. The molding member may cover the upper package substrate 310 and the upper semiconductor chips 320. The molding member may be cured to form the upper molding part 330. An upper package 300 may thus be formed.

Referring to FIG. 13, the upper package 300 may undergo a third process to form a through hole TH. The through hole TH may vertically penetrate the upper molding part 330 and the upper package substrate 310. The through hole TH may include a first through hole TH1' that penetrates the upper package substrate 310 and a second through hole TH2' that penetrates the upper molding part 330. The third process may include mechanical drilling. The through hole TH may be formed in a single process. Alternatively, the third process to form the through hole TH may include a first process to form the second through hole TH2' and a second process to form the first through hole TH1'. In this case, the first process may be performed by laser drilling or mechanical drilling, and the second process may be performed by mechanical drilling. When viewed in a plan, the through hole TH may be formed on a central portion of the upper package substrate 310 and between the upper semiconductor chips 320.

Referring to FIG. 14, the upper package 300 may be mounted on the lower package 100. The upper package 300 may be aligned onto the lower package 100. Connection terminals 305 may be provided between the upper package 300 and the lower package 100. Afterwards, the connection terminals 305 may undergo a reflow process to mount the upper package substrate 310 on the interposer substrate 200. In this case, the upper package substrate 310 may be spaced apart from a top surface of the lower molding part 130.

An under-fill part (see 400 of FIG. 2A) may be formed between the upper package 300 and the lower package 100. For example, an under-fill member 430 may fill a space between the upper package 300 and the lower package 100. For example, as indicated by arrows in FIG. 14, the under-fill member 430 may be externally introduced into the through hole TH of the upper package 300. The under-fill member 430 may pass through the through hole TH and then may flow towards the outside of a semiconductor package.

According to exemplary embodiments of the present inventive concept, the upper molding part 330 may extend into the through hole TH, but may not protrude onto a bottom surface (see 310b of FIG. 2B) of the upper package substrate 310. Therefore, the upper package 300 may have a substantially flat bottom surface and may have low resistance to flow of the under-fill member 430. The under-fill member 430 may thus be easily introduced to fill a space between the upper package substrate 310 and the lower molding part 130, which may reduce the creation of voids, such as air gaps, between the upper package substrate 310 and the lower molding part 130.

Referring back to FIG. 2A, a curing process may be performed on the under-fill member 430 of FIG. 14. The under-fill member 430 may be cured to form an under-fill part 400. Thereafter, external terminals 105 may be formed on a bottom surface of the lower package substrate 110. Through the processes above, a semiconductor package may be fabricated as shown in FIG. 2A.

A semiconductor package according to exemplary embodiments of the present inventive concept may include an under-fill part that is capable of compensating for a difference in a thermal expansion coefficient between upper and lower portions of the semiconductor package. Therefore, the semiconductor package may see decreases in heat-induced warpage and increases in structural stability. Moreover, the under-fill part may efficiently radiate heat generated from a lower semiconductor chip and may rigidly attach upper and lower packages.

A method of fabricating a semiconductor package according to exemplary embodiments of the present inventive concept may form a through hole on a central portion of an upper package such that an under-fill member may have low resistance to flow, the under-fill member may easily flow, and the under-fill member may not overflow. Therefore, the under-fill member may be prevented from being unnecessarily used. Furthermore, because the under-fill member is easily introduced by way of the through hole, the creation of voids, such as air gaps, may be reduced between an upper package substrate and a lower molding part.

While the inventive concept has been described with reference to exemplary embodiments thereof, it will be understood by one of ordinary skill in the art that variations in form and detail may be made thereto without departing from the spirit and scope of the present inventive concept.

What is claimed is:

1. A method of fabricating a semiconductor package, the method comprising:
    forming a first through hole that penetrates a package substrate;
    coating a molding member on the package substrate to form a molding part, wherein, when the molding part is formed, the molding member is introduced into the first through hole;
    forming a second through hole that penetrates the molding part and is connected to the first through hole;
    mounting the package substrate on a package; and
    placing an under-fill member in the first through hole and the second through hole to fill a space between the package substrate and the package.

2. The method of claim 1, wherein the molding member protrudes onto a bottom surface of the package substrate.

3. The method of claim 2, wherein, after forming the second through hole,
    a portion of the molding part extends into the first through hole and covers an inner wall of the first through hole.

4. The method of claim 1, wherein the second through hole is formed to penetrate the molding member in the first through hole.

5. The method of claim 1, wherein
    the first through hole is formed after forming the molding part, and
    the second through hole and the first through hole are formed in a single process.

6. The method of claim 5, wherein
    the second through hole and the first through hole have the same shape when viewed in a plan, and
    an inner wall of the second through hole and an inner wall of the first through hole are coplanar with each other.

7. The method of claim 1, wherein the package includes:
    a lower package substrate;
    a lower semiconductor chip on the lower package substrate; and
    a lower molding part that is on the lower package substrate and covers the lower semiconductor chip,
    wherein the package substrate is electrically connected to the lower package substrate through a plurality of connection terminals that are between the package substrate and the lower package substrate.

8. The method of claim 7, wherein the package further includes an interposer substrate on the lower semiconductor chip, the interposer substrate being embedded in the lower molding part and being adjacent to a top surface of the lower molding part, and
    the interposer substrate is electrically connected to the package substrate through at least one of the connection terminals on a top surface of the interposer substrate.

9. The method of claim 8, wherein
    the interposer substrate has a third through hole that penetrates the interposer substrate,
    the under-fill member extends into the third through hole, and
    the under-fill member fills a space between the interposer substrate and the lower molding part.

10. The method of claim 7, wherein the under-fill member contacts an entire bottom surface of the package substrate and a top surface of the lower molding part.

11. A method of fabricating a semiconductor package, the method comprising:
    forming a first through hole that penetrates a package substrate;
    coating a molding member on the package substrate to form a molding part;
    forming a second through hole that penetrates the molding part and is connected to the first through hole;
    mounting the package substrate on a package; and
    placing an under-fill member in the first through hole and the second through hole to fill a space between the package substrate and the package,
    wherein a thermal expansion coefficient of the under-fill member is greater than a thermal expansion coefficient of the molding part and a thermal expansion coefficient of the package substrate.

12. A method of fabricating a semiconductor package, the method comprising:
    providing a lower package including a lower package substrate, a lower semiconductor chip on the lower package substrate, and a lower molding part covering the lower semiconductor chip on the lower package substrate;
    providing an interposer substrate on the lower molding part, the interposer substrate has a first through hole penetrating the interposer substrate;
    providing an upper package comprising:
        mounting an upper semiconductor chip on an upper package substrate that has a second through hole penetrating the upper package substrate,
        forming an upper molding part on the upper package substrate to cover the upper semiconductor chip and to fill inside the second through hole, and
        forming a third through hole that penetrates the upper molding part, the third through hole is positioned inside the second through hole;
    mounting the upper package on the interposer substrate; and placing an under-fill member in the third through hole to fill a space between the upper package substrate and the interposer substrate, and in the first through hole to fill a space between the interposer substrate and the lower molding part.

13. The method of claim 12, wherein the upper molding member is introduced into the second through hole.

14. The method of claim 13, wherein the upper molding member protrudes onto a bottom surface of the upper package substrate.

15. The method of claim 12, wherein
the second through hole is formed after forming the upper molding part, and
the third through hole and the second through hole are formed in a single process.

16. The method of claim 15, wherein
the third through hole and the second through hole have the same shape when viewed in a plan, and
an inner wall of the third through hole and an inner wall of the second through hole are coplanar with each other.

17. The method of claim 12, wherein a thermal expansion coefficient of the under-fill member is greater than a thermal expansion coefficient of the upper molding part and a thermal expansion coefficient of the upper package substrate.

18. The method of claim 12, wherein the interposer substrate is electrically connected to the upper package substrate through at least one of the connection terminals on a top surface of the interposer substrate.

19. The method of claim 12, wherein the under-fill member contacts an entire bottom surface of the upper package substrate and a bottom surface of the interposer substrate.

* * * * *